(12) United States Patent
Kamitsubo et al.

(10) Patent No.: US 11,558,958 B2
(45) Date of Patent: Jan. 17, 2023

(54) LAMINATED BODY AND METHOD FOR MANUFACTURING THE SAME

(71) Applicant: Murata Manufacturing Co., Ltd., Nagaokakyo (JP)

(72) Inventors: Yusuke Kamitsubo, Nagaokakyo (JP); Tsuyoshi Katsube, Nagaokakyo (JP); Ryosuke Takada, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/881,702

(22) Filed: Aug. 5, 2022

(65) Prior Publication Data

US 2022/0377886 A1 Nov. 24, 2022

Related U.S. Application Data

(63) Continuation of application No. 17/206,303, filed on Mar. 19, 2021, now Pat. No. 11,445,606, which is a continuation of application No. PCT/JP2019/039075, filed on Oct. 3, 2019.

(30) Foreign Application Priority Data

Oct. 4, 2018 (JP) .............................. JP2018-189264

(51) Int. Cl.
*H05K 1/03* (2006.01)
*H05K 1/02* (2006.01)
*H05K 3/46* (2006.01)
*H05K 3/00* (2006.01)

(52) U.S. Cl.
CPC ............ *H05K 1/036* (2013.01); *H05K 1/0284* (2013.01); *H05K 3/0064* (2013.01); *H05K 3/4611* (2013.01); *H05K 3/4632* (2013.01); *H05K 2201/0129* (2013.01); *H05K 2201/041* (2013.01); *H05K 2203/0278* (2013.01)

(58) Field of Classification Search
CPC ...... H05K 1/024; H05K 1/0353; H05K 1/036; H05K 1/0366; H05K 1/0373
See application file for complete search history.

(56) References Cited

PUBLICATIONS

Kamitsubo et al., "Laminated Body and Method for Manufacturing the Same", U.S. Appl. No. 17/206,303, filed Mar. 19, 2021.

*Primary Examiner* — Jeremy C Norris
(74) *Attorney, Agent, or Firm* — Keating & Bennett, LLP (57) ABSTRACT

A stacked body includes a first resin layer including a thermoplastic first resin as a main material, a pattern including a conductor layer on one principal surface of the first resin layer, and a second resin layer including a thermoplastic second resin as a main material. The first resin layer is softer than the second resin layer. The first resin layer has a lower dielectric constant than the second resin layer. A pattern including the conductor layer is at least partially embedded in the first resin layer, and includes a portion in contact with the first resin layer along a layer direction (X-Y plane) of the first resin layer and a portion in contact with the first resin layer along a stacking direction (X-Z plane) of the first resin layer, the second resin layer, and the pattern including the conductor layer.

8 Claims, 10 Drawing Sheets

LAMINATED BODY AND METHOD FOR MANUFACTURING THE SAME

CROSS REFERENCE TO RELATED APPLICATIONS

This application claims the benefit of priority to Japanese Patent Application No. 2018-189264 filed on Oct. 4, 2018 and is a Continuation Application of PCT Application No. PCT/JP2019/039075 filed on Oct. 3, 2019. The entire contents of each application are hereby incorporated herein by reference.

BACKGROUND OF THE INVENTION

1. Field of the Invention

The present invention relates to a stacked body used for a cable, a circuit substrate, and a method for manufacturing the same.

2. Description of the Related Art

Generally, a cable or a circuit substrate having a multilayer structure is configured by stacking and integrating insulating base materials on which a conductor pattern is formed. Then, the above-described conductor pattern and the material of the insulating base material are selected according to the electromechanical characteristics required for the circuit substrate.

In order to reduce the thickness of the transmission line portion formed on the cable or circuit substrate, it is preferable that the dielectric constant of the insulating base material is low. In addition, in order to increase the speed and frequency of the transmission line, it is desired that the dielectric loss tangent of the insulating base material is small. Furthermore, in order to accommodate the cable or circuit substrate in a limited space, it is preferable that the insulating base material is flexible.

WO 2017/179542 shows a stacked body including a fluororesin as an insulating base material.

The stacked body described in WO 2017/179542 is a stacked body in which a thermoplastic resin layer including a liquid crystal polymer is stacked on a fluororesin layer. A stacked body having such a structure makes it easier to maintain the overall shape as compared with a substrate made of a soft fluororesin alone.

However, in the circuit substrate made of the above-described stacked body, since the conductor pattern has a structure in contact with a resin layer having a relatively high dielectric constant and a high dielectric loss tangent, such as a liquid crystal polymer, the effect of improving high frequency characteristics is small.

SUMMARY OF THE INVENTION

Preferred embodiments of the present invention provide stacked bodies each of which is easy to maintain its overall shape and has excellent high frequency characteristics, and also provide methods for manufacturing the same.

A stacked body according to a preferred embodiment of the present invention includes a first resin layer made of thermoplastic; a conductor pattern provided on one principal surface of the first resin layer; and a second resin layer made of thermoplastic. The first resin layer is softer than the second resin layer. The first resin layer has a lower dielectric constant than the second resin layer. The conductor pattern includes a portion in contact with the first resin layer along a layer direction of the first resin layer and a portion in contact with the first resin layer along a stacking direction of the first resin layer, the second resin layer, and the conductor pattern.

For example, the first resin is a fluororesin and the second resin is a liquid crystal polymer. According to the above configuration, since the main resin layer in contact with the conductor pattern is a resin layer having a relatively small dielectric constant, it can be used as a cable or a circuit substrate having excellent high frequency characteristics.

A method for manufacturing a stacked body according to a preferred embodiment of the present invention includes stacking a conductor foil on a first resin layer including a first resin as a main material; stacking a second resin layer including a second resin as a main material on the first resin layer to form a stacked sheet including the first resin layer, the second resin layer, and the conductor foil; patterning the conductor foil; and stacking and heat-pressing a plurality of the stacked sheets to cause at least a portion of the conductor foil to be embedded in the first resin layer.

According to the above manufacturing method, the conductor pattern in the stacked body is positively embedded in the first resin layer, and the stacked body having excellent high frequency characteristics can be easily obtained.

Another method for manufacturing a stacked body according to a preferred embodiment of the present invention includes stacking a second resin layer including a second resin as a main material on a first resin layer including a first resin as a main material; forming a conductor film on the first resin layer; attaching a mask film onto the conductor film; patterning the mask film by photolithography; plating and forming a conductor film on an opening of the conductor film; peeling off the mask film; etching and removing the conductor film to form a stacked sheet including the first resin layer, the second resin layer, and the conductor film; and stacking and heat-pressing a plurality of the stacked sheets to cause at least a portion of the conductor film to be embedded in the first resin layer.

According to the above manufacturing method, the conductor pattern in the stacked body is positively embedded in the first resin layer, and the stacked body having excellent high frequency characteristics can be easily obtained.

According to preferred embodiments of the present invention, it is possible to obtain stacked bodies that are each easy to maintain overall shapes thereof and have excellent high frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, aspects of stacked bodies according to preferred embodiments of the present invention and the methods for manufacturing the same will be described.

A stacked body according to a preferred embodiment of the present invention includes a first resin layer including a thermoplastic first resin as a main material, a conductor layer provided on one principal surface of the first resin layer, and a second resin layer including a thermoplastic second resin as a main material. The first resin layer is softer than the second resin layer. The first resin layer has a lower dielectric constant than the second resin layer. The conductor pattern is at least partially embedded in the first resin layer, and includes a portion in contact with the first resin layer along a layer direction of the first resin layer and a portion in contact with the first resin layer along a stacking direction of the first resin layer, the second resin layer, and the conductor pattern. According to this configuration, since the main resin layer in contact with the conductor pattern is a resin layer having a relatively small dielectric constant, it can be used as a cable or a circuit substrate having excellent high frequency characteristics.

In a stacked body according to a preferred embodiment of the present invention, in the cross section of the stacked body in the stacking direction, in a peripheral length of the conductor pattern, a length of a portion where the conductor pattern is in contact with the first resin layer is larger than a length of a portion in contact with the second resin layer. With this structure, most of the conductor pattern is in contact with the first resin layer, and the high frequency characteristics are effectively improved.

In a stacked body according to a preferred embodiment of the present invention, the thickness of the second resin layer is larger than the thickness of the first resin layer. This structure improves the shape stability of the entire stacked body.

In a stacked body of according to a preferred embodiment of the present invention, the main material of the first resin layer is a fluororesin, and the main material of the second resin layer is a liquid crystal polymer.

In a stacked body according to a preferred embodiment of the present invention, the cross-sectional shape of the conductor pattern in the stacking direction of the stacked body includes a corner portion buried in the first resin layer. With this structure, the periphery of the corner portion having high electric field intensity is covered with the first resin layer having a low dielectric constant, so that the effect of improving the high frequency characteristics is great.

In a stacked body according to a preferred embodiment of the present invention, the first resin layer includes a protruding portion (first protruding portion) along the corner portion of the conductor pattern buried in the first resin layer on a surface opposite to that of the conductor pattern. With this structure, the periphery of the corner portion having high electric field intensity is more thickly covered with the first resin layer having a low dielectric constant, so that the effect of improving the high frequency characteristics is great.

A stacked body according to a preferred embodiment of the present invention includes an inclined portion at an edge of the conductor pattern in a cross-sectional shape. The corner portion buried in the first resin layer has an acute angle. With this structure, the portion having higher electric field intensity can be covered with the first resin layer, and the high frequency characteristics are effectively improved.

In a stacked body according to a preferred embodiment of the present invention, a surface roughness of one principal surface in contact with the first resin layer of the conductor pattern is larger than a surface roughness of the other principal surface. According to this structure, since a surface have a rougher surface roughness of the conductor pattern is in contact with the resin layer having a low dielectric constant, the transmission loss in the high frequency region can be effectively reduced.

In a stacked body according to a preferred embodiment of the present invention, the second resin layer sandwiches the first resin layer from both sides in the stacking direction. According to this structure, the shape stability of the entire stacked body is effectively improved.

In a stacked body according to a preferred embodiment of the present invention, the first resin layer sandwiches the conductor pattern from both sides in the stacking direction. According to this structure, since the entire region having a high electric field intensity is covered with the first resin layer having a low dielectric constant, the effect of improving the high frequency characteristics is great.

A stacked body according to a preferred embodiment of the present invention includes a plurality of stacked sheets including a single first resin layer, a single second resin layer, and a single layer of the conductor pattern. The conductor pattern of one stacked sheet of stacked sheets adjacent in the stacking direction and the second resin layer of the other stacked sheet are in contact with each other. According to this structure, since the shape of the stacked sheet alone is less likely to be deformed, handling in the manufacturing step becomes easy. In addition, the substrate is less likely to be deformed even when an external force is applied when the substrate is dropped or components are mounted.

A stacked body according to a preferred embodiment of the present invention includes a plurality of stacked sheets including a single first resin layer, a single second resin layer, and a single layer of the conductor pattern. Each of two stacked sheets adjacent to each other in the stacking direction includes an interlayer connecting conductor that penetrates the first resin layer and the second resin layer and has an opposite surface wider than a surface in contact with the conductor pattern. The opposite surfaces of the interlayer connecting conductors face each other and the interlayer connecting conductors are directly joined. According to this structure, since the interlayer connecting conductors are joined to each other on wider surfaces, even if the first resin layer and the second resin layer flow during heating and pressurization such as a stacked press, it is possible to reduce the joining failure between the interlayer connecting conductors due to the displacement of the interlayer connecting conductors.

In a stacked body according to a preferred embodiment of the present invention, the plurality of stacked sheets include a first stacked sheet, a second stacked sheet, and a third stacked sheet sequentially arranged in the stacking direction. The conductor pattern provided on the second stacked sheet is a signal conductor pattern, the conductor pattern provided on the first stacked sheet is a first ground conductor pattern, and the conductor pattern provided on the third stacked sheet is a second ground conductor pattern. The signal conductor pattern, the first ground conductor pattern, and the second ground conductor pattern define a main portion of a transmission line. According to this structure, a signal transmission line having a low transmission loss can be provided.

In a stacked body according to a preferred embodiment of the present invention, the first stacked sheet includes a first interlayer connecting conductor conducting to the first ground conductor pattern, and the second stacked sheet includes a second interlayer connecting conductor conducting to the second ground conductor pattern. The first interlayer connecting conductor and the second interlayer connecting conductor overlap in the stacking direction. According to this structure, since the stability of the distance between the signal conductor pattern and the first ground conductor pattern and second ground conductor pattern with respect to bending of the stacked body is high, the electrical characteristics of the signal transmission line are maintained.

A method for manufacturing a stacked body according to a preferred embodiment of the present invention includes stacking a conductor foil on a first resin layer including a first resin as a main material; stacking a second resin layer including a second resin as a main material on the first resin layer to form a stacked sheet including the first resin layer, the second resin layer, and the conductor foil; and stacking and heat-pressing a plurality of the stacked sheets to cause at least a portion of the conductor foil to be embedded in the first resin layer. According to this method, the conductor pattern in the stacked body is positively embedded in the first resin layer, and a stacked body having excellent high frequency characteristics can be easily obtained.

A method for manufacturing a stacked body according to a preferred embodiment of the present invention includes stacking a second resin layer including a second resin as a main material on a first resin layer including a first resin as a main material; forming a first conductor layer on the first resin layer; attaching a dry film resist onto the first conductor layer; forming an opening in the dry film resist by photolithography; plating and forming a second conductor layer on the opening; peeling off the dry film resist; etching and removing the first conductor layer and the second conductor layer to form a stacked sheet including the first resin layer, the second resin layer, and a conductor pattern; and stacking and heat-pressing a plurality of the stacked sheets to cause at least a portion of the conductor pattern to be embedded in the first resin layer. According to this method, the conductor pattern in the stacked body is positively embedded in the first resin layer, and a stacked body having excellent high frequency characteristics can be easily obtained.

Hereinafter, a plurality of preferred embodiments of the present invention will be described with reference to concrete examples and the drawings. The same reference numerals are provided to the same or corresponding portions and elements in the drawings. Although the preferred embodiments are shown separately for convenience of description in consideration of the description of the main points or the ease of understanding, partial replacement or combination of the configurations shown in different preferred embodiments is possible. In and after the second preferred embodiment, the description of matters common to those in the first preferred embodiment will be omitted, and only the differences will be described. In particular, the same actions and effects due to the same configurations will not be mentioned one by one for each preferred embodiment.

First Preferred Embodiment

Figure 1:
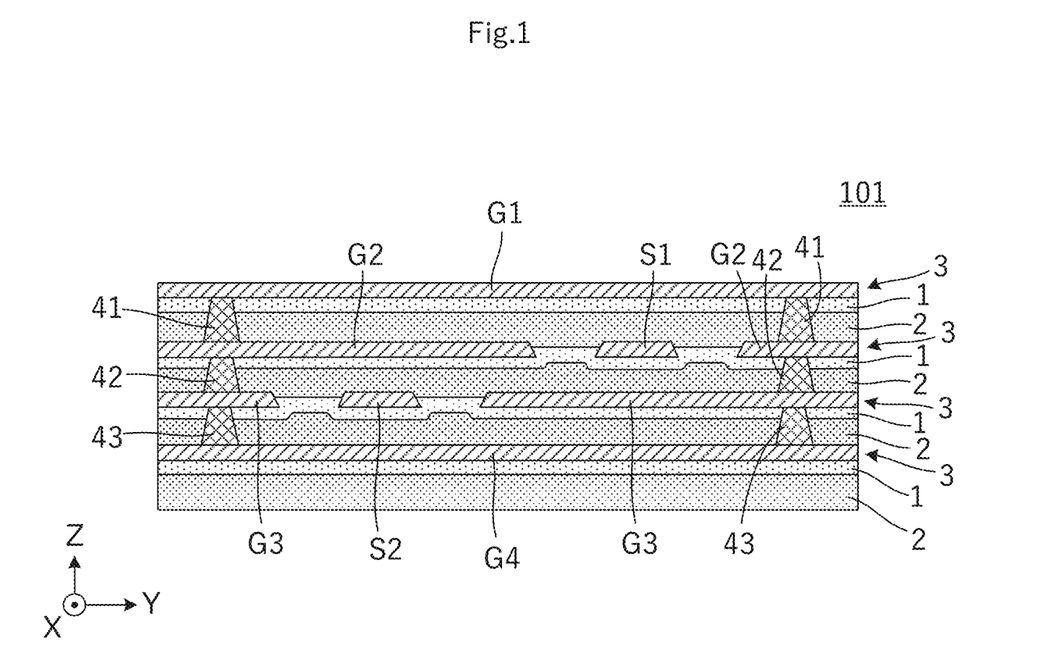
FIG. 1 is a longitudinal sectional view of a stacked body 101 according to a first preferred embodiment of the present invention.
Figure 2A:
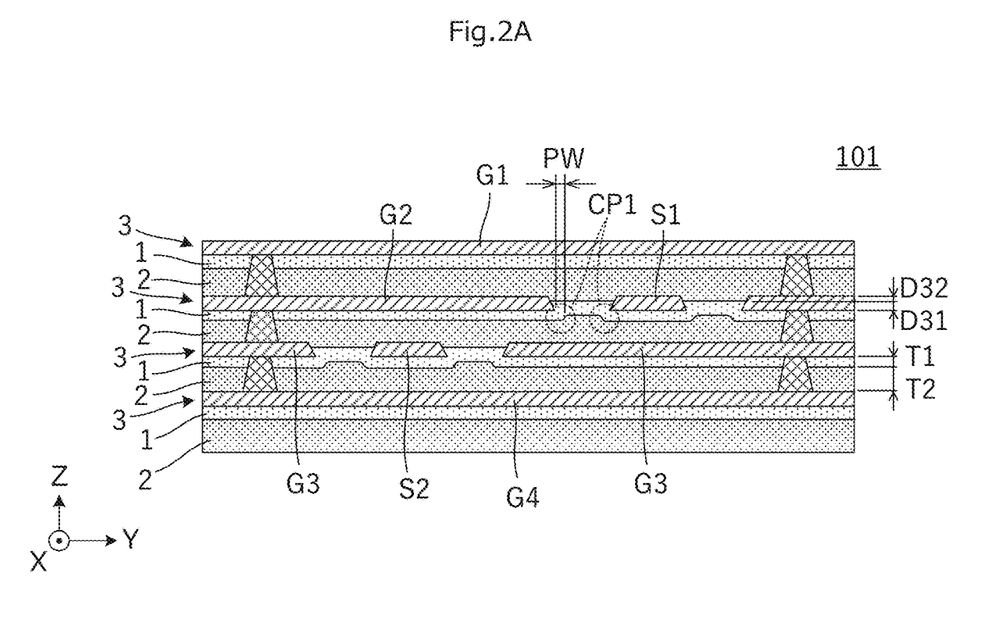
FIG. 2A is a longitudinal sectional view of the stacked body 101 according to the first preferred embodiment of the present invention.
Figure 2B:
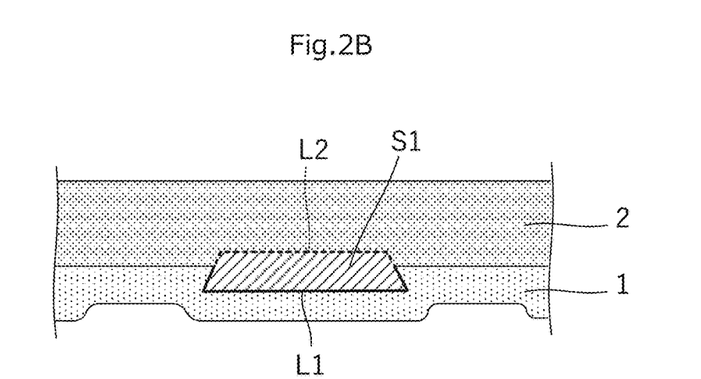
FIG. 2B is an enlarged cross-sectional view near the signal conductor pattern S1.

FIGS. 1, 2A, and 2B are longitudinal sectional views of a stacked body 101 according to a first preferred embodiment of the present invention. The stacked body 101 is used as a cable including two transmission lines. As shown in FIG. 1, the stacked body 101 includes a first resin layer 1 including a thermoplastic first resin as a main material, a conductor layer 3 provided on one principal surface of the first resin layer 1, and a second resin layer 2 including a thermoplastic second resin as a main component.

The first resin of the first resin layer 1 is preferably a fluororesin, such as polytetrafluoroethylene <<PTFE>> and perfluoroalkoxy alkane <<PFA>>, for example. In addition, the second resin of the second resin layer 2 is preferably, for example, liquid crystal polymer <<LPC>>. The first resin layer 1 is softer than the second resin layer 2, and the first resin layer 1 has a lower dielectric constant than the second resin layer 2. In addition, the first resin layer 1 has a smaller dielectric loss tangent than the second resin layer 2. Here, as parameters representing the hardness of the resin layer, Vickers hardness, Knoop hardness, durometer hardness, Barcol hardness, ultra-low hardness (JIS 2255), and the like, for example, can be used. In addition, when compared in terms of elastic modulus, the first resin layer 1 has a lower elastic modulus than the second resin layer 2.

The conductor layer 3 defines the signal conductor patterns S1 and S2 and the ground conductor patterns G1, G2, G3, and G4. In this example, the signal conductor pattern S1, the ground conductor patterns G1, G2, and G3, and the first resin layer 1 and the second resin layer 2 interposed between the ground conductor pattern G1 and the ground conductor pattern G3 define the first grounded coplanar line. Similarly, the signal conductor pattern S2, the ground conductor patterns G2, G3, and G4, and the first resin layer 1 and the second resin layer 2 interposed between the ground conductor pattern G2 and the ground conductor pattern G4 define the second grounded coplanar line.

In addition, the stacked body 101 includes an interlayer connecting conductor 41 for conducting between the ground conductor patterns G1 and G2, an interlayer connecting conductor 42 for conducting between the ground conductor patterns G2 and G3, and an interlayer connecting conductor 43 for conducting between the ground conductor patterns G3 and G4.

According to the configuration of the stacked body 101 of the present preferred embodiment, since the conductor layer 3 is in contact with the first resin layer 1 having a relatively small dielectric constant, the stacked body 101 can be used as a cable or a circuit substrate having excellent high frequency characteristics. That is, when a transmission line having a predetermined characteristic impedance, such as 50Ω, for example, is configured, the line width of the signal conductor pattern can be increased according to the low dielectric constant of the dielectric layer, and thus the conductor loss can be reduced. In addition, instead of increasing the line width of the signal conductor pattern, the dielectric layer including the first resin layer 1 and the second resin layer 2 can be made thinner, such that the stacked body 101 can be made thinner. Furthermore, since the first resin layer 1 has a smaller dielectric loss tangent than the second resin layer 2, the dielectric loss is also reduced. Thus, the stacked body 101 can be used as a cable or circuit substrate having excellent high frequency characteristics.

FIGS. 2A and 2B are diagrams for illustrating particularly the pattern by the conductor layer 3, and the detailed structure of the first resin layer 1 and the second resin layer 2. Hereinafter, the structure of each portion will be described with reference to FIGS. 2A and 2B.

The pattern formed by the conductor layer 3 corresponds to the "conductor pattern". Of the patterns formed by the conductor layer 3, in particular, each of the signal conductor patterns S1 and S2 and the ground conductor patterns G2 and G3 partially embeds in the first resin layer 1. As a result, each of the signal conductor patterns S1 and S2 and the ground conductor patterns G2 and G3 includes not only a portion in contact with the first resin layer 1 along the layer direction of the first resin layer 1, that is, a portion in contact with the first resin layer 1 along the X-Y plane, but also a portion along the stacking direction (Z-axis direction) of the first resin layer 1, the second resin layer 2, and the conductor layer 3, that is, a portion in contact with the first resin layer 1 along the X-Z plane. According to this configuration, since the main resin layer in contact with the conductor layer 3 is the first resin layer 1 having a relatively small dielectric constant, the above-described advantageous effects obtained by using the resin layer having a low dielectric constant for the dielectric layer can be increased.

FIG. 2B is an enlarged cross-sectional view near the signal conductor pattern S1. Regarding the pattern formed by the conductor layer 3, in the cross section in the stacking direction (Z-axis direction) of the stacked body 101, in the peripheral length of the conductor pattern, the length of the portion where the pattern formed by the conductor layer 3 embeds in the first resin layer 1 is longer than the length of the portion where the pattern does not embed in the first resin layer 1. In the example shown in FIG. 2B, in the peripheral length in the cross-sectional shape of the signal conductor pattern S1, if the length of the portion in contact with the first resin layer 1 (corresponding to the length of the portion that sinks in the first resin layer 1) is denoted by L1, and the length of the portion in contact with the second resin layer 2 (corresponding to the length of the portion that does not sink in the first resin layer 1) is denoted by L2, L1>L2. In addition, as shown in FIG. 2A, among the thicknesses of the patterns formed by the conductor layer 3, the depth D31 embedded in the first resin layer 1 is larger than the depth D32 embedded in the second resin layer 2. With this structure, most of the pattern formed by the conductor layer 3 comes into contact with the first resin layer 1, and the high frequency characteristics are effectively improved.

It should be noted that in the present preferred embodiment, as the cross-sectional shape of the pattern including the conductor layer 3, an example of a trapezoidal shape with the upper side shorter than the lower side is shown, but a trapezoidal shape with the upper side longer than the lower side may be used. Even in this case, if the above relationship is satisfied, the high frequency characteristics are effectively improved. A pattern of a trapezoidal shape with the upper side longer than the lower side can be achieved by providing plating on the resin layer.

In addition, the thickness T2 of the second resin layer 2 is larger than the thickness T1 of the first resin layer 1. This structure improves the shape stability of the entire stacked body 101.

Furthermore, the cross-sectional shape of the pattern including the conductor layer 3 in the stacking direction (Z-axis direction) of the stacked body 101 includes a corner portion embedded in the first resin layer 1. With this structure, the periphery of the corner portion having high electric field intensity is covered with the first resin layer 1 having a low dielectric constant, so that the effect of improving the high frequency characteristics is great.

The pattern including the conductor layer 3 includes an inclined portion at the edge in the cross section in the stacking direction (Z-axis direction) of the stacked body 101, and the corner portion embedded in the first resin layer 1 has an acute angle. That is, as shown in FIGS. 2A and 2B, the cross-sectional shape of the pattern formed by the conductor layer 3 is trapezoidal. With this structure, the portion having higher electric field intensity can be covered with the first resin layer 1, and the high frequency characteristics are effectively improved.

In addition, on the surface opposite to the pattern formed by the conductor layer 3, the first resin layer 1 includes a protruding portion (first protruding portion) CP1 along the corner portion of the pattern formed by the conductor layer 3 embedded in the first resin layer 1. In other words, in a plan view, the first resin layer 1 protrudes from the corner portion of the pattern formed by the conductor layer 3 by the protrusion width PW. With this structure, the periphery of the corner portion having high electric field intensity is more thickly covered with the first resin layer having a low dielectric constant, so that the effect of improving the high frequency characteristics is great.

Figure 3:
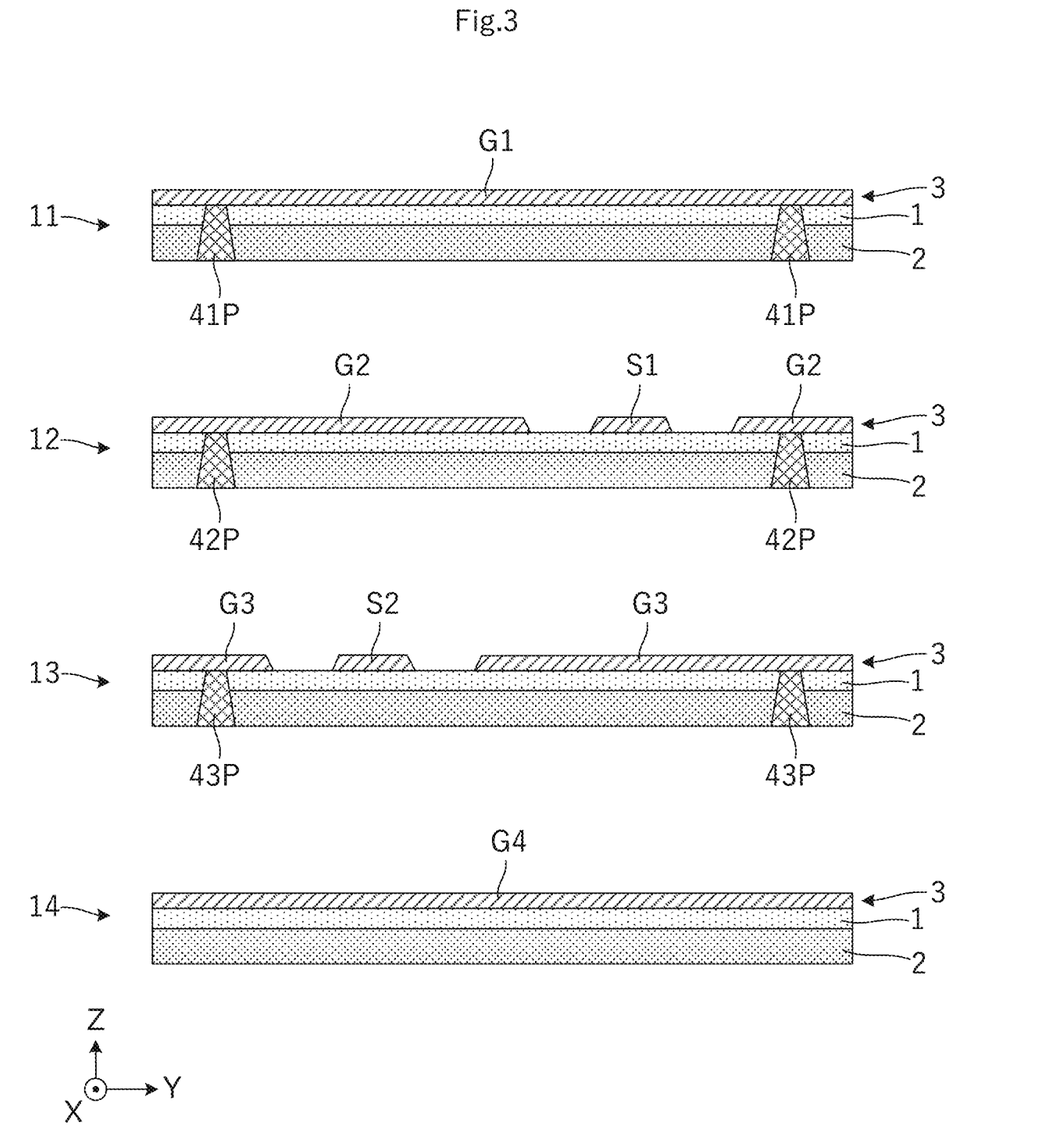
FIG. 3 is a longitudinal sectional view of the stacked body 101 during manufacturing.
Figure 4:
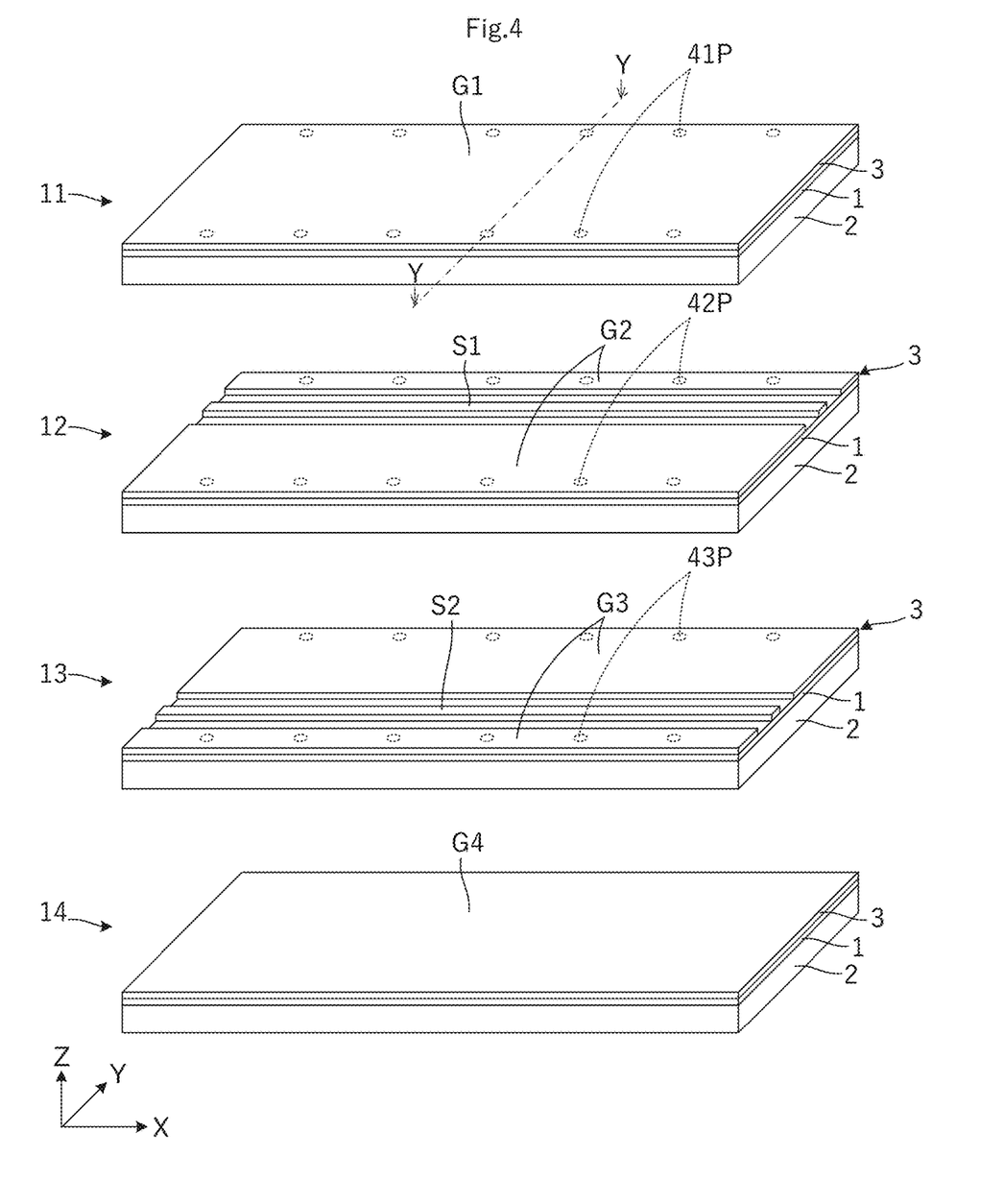
FIG. 4 is a perspective view of the stacked body 101 during manufacturing.

FIG. 3 is a longitudinal sectional view of the stacked body 101 of the present preferred embodiment during manufacturing. In addition, FIG. 4 is a perspective view of the stacked body 101 during manufacturing. FIG. 3 is a longitudinal sectional view taken along line Y-Y in FIG. 4.

The stacked body 101 includes a first stacked sheet 11, a second stacked sheet 12, a third stacked sheet 13, and a fourth stacked sheet 14 at a stage before lamination. Each of the stacked sheets 11, 12, 13, and 14 includes a single first resin layer 1, a single conductor layer 3 provided on one surface of the first resin layer 1, and a second resin layer 2 joined to the other surface of the first resin layer 1.

In the example shown in FIG. 3, in the first stacked sheet 11, an interlayer connecting conductor 41P in a state before heating which conducts with the conductor layer 3 is provided in the first resin layer 1 and the second resin layer 2. The conductor layer 3 of the first stacked sheet 11 is formed as a ground conductor pattern G1. In the second stacked sheet 12, an interlayer connecting conductor 42P in a state before heating which conducts with the conductor layer 3 is provided in the first resin layer 1 and the second resin layer 2. The conductor layer 3 of the second stacked sheet 12 is formed as a ground conductor pattern G2 and a signal conductor pattern S1. Similarly, in the third stacked sheet 13, an interlayer connecting conductor 43P in a state before heating which conducts with the conductor layer 3 is formed in the first resin layer 1 and the second resin layer 2. The conductor layer 3 of the third stacked sheet 13 is formed as a ground conductor pattern G3 and a signal conductor pattern S2. The conductor layer 3 of the fourth stacked sheet 14 is formed as a ground conductor pattern G4.

The stacked body 101 shown in FIG. 1 is formed by stacking the stacked sheets 11 to 14, and heating and pressing them.

Figure 5:
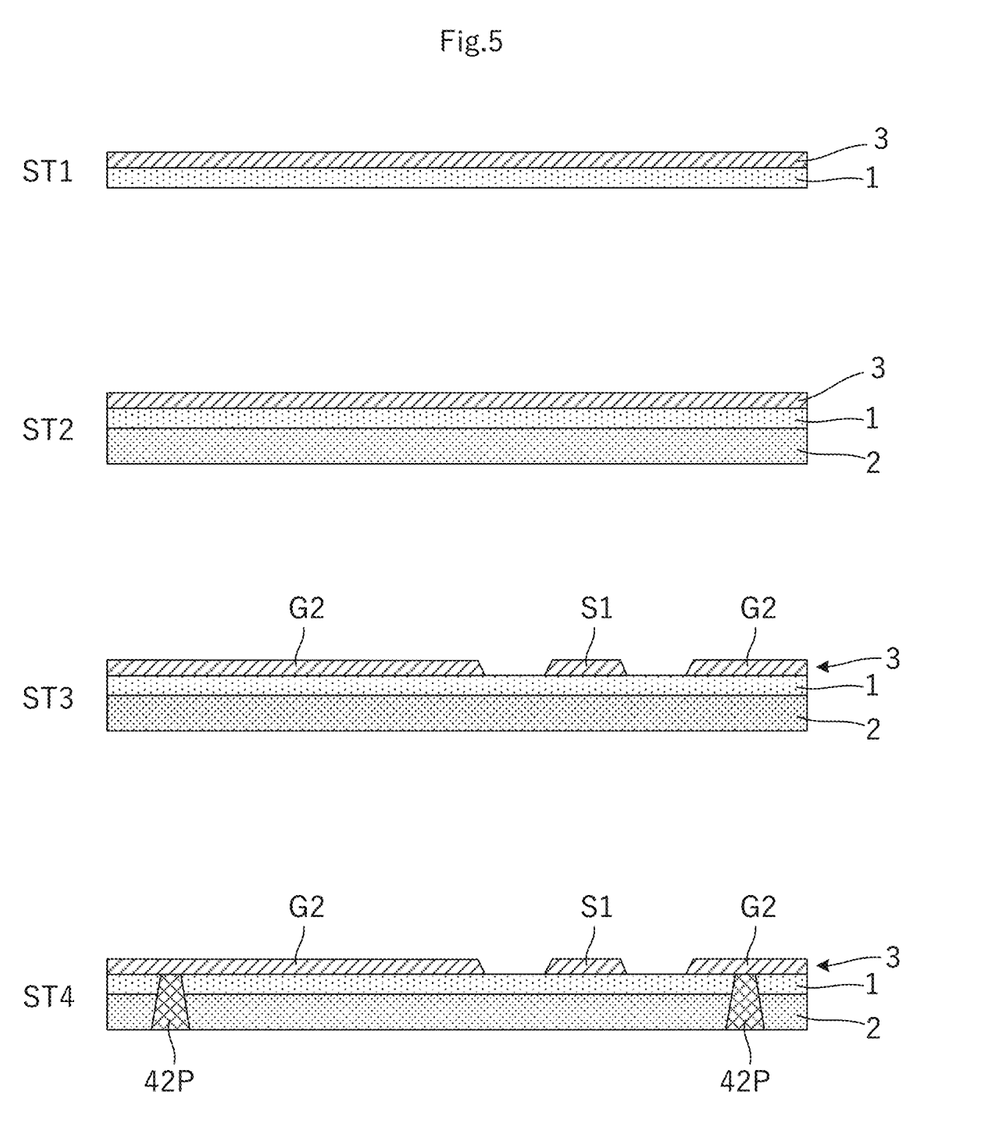
FIG. 5 is a diagram showing a method for manufacturing the stacked body 101.

FIG. 5 is a diagram showing a method for manufacturing the stacked body 101. Here, the second stacked sheet 12 shown in FIGS. 3 and 4 is taken as an example. In FIG. 5, ST1 to ST4 represent the numbers of each step. In step ST1, a conductor layer 3 made of Cu foil is stacked on one surface of the first resin layer 1. In step ST2, the stacked sheet is formed by stacking the second resin layer 2 on the other surface of the first resin layer 1. As described above, since the second resin layer 2 includes LCP as a main material, the second resin layer 2 is harder than the first resin layer 1 including fluororesin as a main material. Therefore, this stacked sheet has high shape retention.

In step ST3, photolithography patterns the conductor layer 3 to form, for example, a signal conductor pattern S1 and a ground conductor pattern G2.

In step ST4, an opening extending to the conductor layer 3 from the second resin layer 2 side is formed by laser processing, a conductive paste including Cu, Sn, flux, and solvent is filled in the opening, and then the conductive paste is dried, such that the interlayer connecting conductor 42P in a state before heating is formed.

The stacked sheets 11, 13, and 14 shown in FIGS. 3 and 4 are also manufactured in the same steps as described above. Laminating the stacked sheets 11 to 14 produced in this manner and heating and pressing them at about 300° C. causes the interlayer connecting conductor 42P and the like in a state before heating to be solidified to be an interlayer connecting conductor. In addition, the conductor layer 3 embeds into the first resin layer 1 by a certain amount. Furthermore, by doing so, the corner portion of the pattern formed by the conductor layer is embedded in the first resin layer 1, and a protruding portion (first protruding portion) CP1 along the corner portion of the pattern formed by the conductor layer 3 is formed (FIGS. 2A and 2B).

In the stacked body 101 of the present preferred embodiment, as shown in FIGS. 1 and 3, the first stacked sheet 11 includes an interlayer connecting conductor 41 (corresponding to the "first interlayer connecting conductor") conducting to the ground conductor pattern G1 (corresponding to the "first ground conductor pattern"), the second stacked sheet 12 includes an interlayer connecting conductor 42 (corresponding to the "second interlayer connecting conductor") conducting to the ground conductor pattern G3 (corresponding to the "second ground conductor pattern"), and the interlayer connecting conductor 41 overlaps with the interlayer connecting conductor 42 in the stacking direction (Z-axis direction). Because of this structure, the stability of the distance between the signal conductor pattern S1 and the ground conductor patterns G1 and G3 with respect to bending of the stacked body 101 is high, so that the electrical characteristics of the signal transmission line are maintained.

Similarly, the second stacked sheet 12 includes an interlayer connecting conductor 42 (corresponding to the "first interlayer connecting conductor") conducting to the ground conductor pattern G2 (corresponding to the "first ground conductor pattern"), the third stacked sheet 13 includes an interlayer connecting conductor 43 (corresponding to the "second interlayer connecting conductor") conducting to the ground conductor pattern G4 (corresponding to the "second ground conductor pattern"), and the interlayer connecting conductor 42 overlaps with the interlayer connecting conductor 43 in the stacking direction (Z-axis direction). Because of this structure, the stability of the distance between the signal conductor pattern S2 and the ground conductor patterns G2 and G4 with respect to bending of the stacked body 101 is high, so that the electrical characteristics of the signal transmission line are maintained.

Second Preferred Embodiment

In a second preferred embodiment of the present invention, a stacked body including a conductor layer different from that of the stacked body shown in the first preferred embodiment in the surface properties of the conductor layer is shown.

Figure 6:
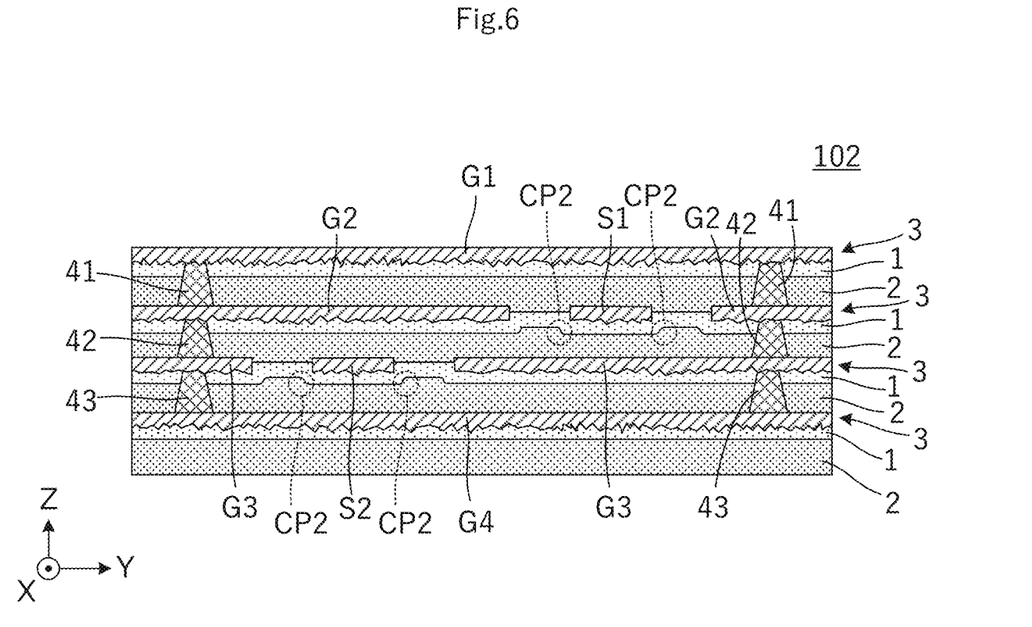
FIG. 6 is a longitudinal sectional view of a stacked body 102 according to a second preferred embodiment of the present invention.

FIG. 6 is a longitudinal sectional view of a stacked body 102 according to a second preferred embodiment of the present invention. The surface properties and cross-sectional shape of the conductor layer 3 are different from those of the stacked body 101 shown in FIG. 1. In the stacked body 102, in the direction shown in FIG. 6, the upper surface of the conductor layer 3 is a shiny side and the lower surface is a matte side. In this way, when the conductor layer 3 having different properties on the front and back surfaces is used, the conductor layer 3 is adhered to the first resin layer 1 so that the matte side is in contact with the first resin layer 1 side and the shiny side is in contact with the second resin layer 2 side. That is, the surface roughness of one principal surface in contact with the first resin layer 1 of the pattern formed by the conductor layer 3 is larger than the surface roughness of the other principal surface. It should be noted that in this example, the edge of the pattern formed by the conductor layer 3 does not include an inclined portion. The remaining structure is as shown in the first preferred embodiment.

According to the present preferred embodiment, since the surface rougher in surface roughness of the pattern formed by the conductor layer 3 is in contact with the first resin layer 1 having a low dielectric constant, in the pattern formed by the conductor layer 3, the portion having a high electric field intensity of the conductor surface due to the skin effect is covered with a resin layer having a low dielectric constant.

Here, suppose that a resin layer having a high dielectric constant is in contact with the surface rougher in surface roughness of the conductor layer 3, the electric field is concentrated on the sharp portion of the surface of the conductor layer 3, the potential difference between adjacent sharp portions and between an adjacent sharp portion and valley portion increases, and the displacement current flowing through the dielectric portion interposed in the portion where the potential difference is high increases. As a result, the actual current flowing near the surface of the conductor pattern also increases. Since this actual current flows on the matte surface of the conductor pattern, its current path length is long and the conductor loss is large. That is, it is preferable to have a structure in which the matte surface of the conductor layer 3 is in contact with the first resin layer (low dielectric constant resin layer) rather than in contact with the second resin layer (high dielectric constant resin layer). As described above, according to the structure in which the surface rougher in surface roughness of the pattern formed by the conductor layer 3 is in contact with the first resin layer 1 having a low dielectric constant, the conductor loss of the conductor layer can be effectively reduced.

In addition, the signal conductor pattern S1 and the signal conductor pattern S2 are sandwiched by the two second protruding portions CP2 in the second resin layer 2. In other words, each of the signal conductor pattern S1 and the signal conductor pattern S2 is sandwiched between the second resin layers 2 in the plane direction perpendicular or substantially perpendicular to the stacking direction. Since the second resin layer 2 is harder than the first resin layer 1, sandwiching the signal conductor pattern S1 and the signal conductor pattern S2 with the second resin layers 2 makes it possible to prevent the signal conductor pattern S1 and the signal conductor pattern S2 from being positionally deviated during stacking. In addition, the holding force of the signal conductor pattern S1 and the signal conductor pattern S2 on the second resin layer 2 can be improved. When the signal conductor pattern S1 and the signal conductor pattern S2 are sufficiently retained by being sandwiched by the second resin layer 2 in this way, the surface roughness of the signal conductor pattern S1 and the signal conductor pattern S2 may be smaller than the surface roughness of the ground conductor patterns G1 to G4. Then, by doing so, the conductor loss of the signal conductor pattern S1 and the signal conductor pattern S2 can be reduced.

Third Preferred Embodiment

In a third preferred embodiment of the present invention, a stacked body different from the stacked body shown in the first preferred embodiment in the connection structure between the interlayer connecting conductors and the connection structure between the stacked sheets is shown.

Figure 7A:
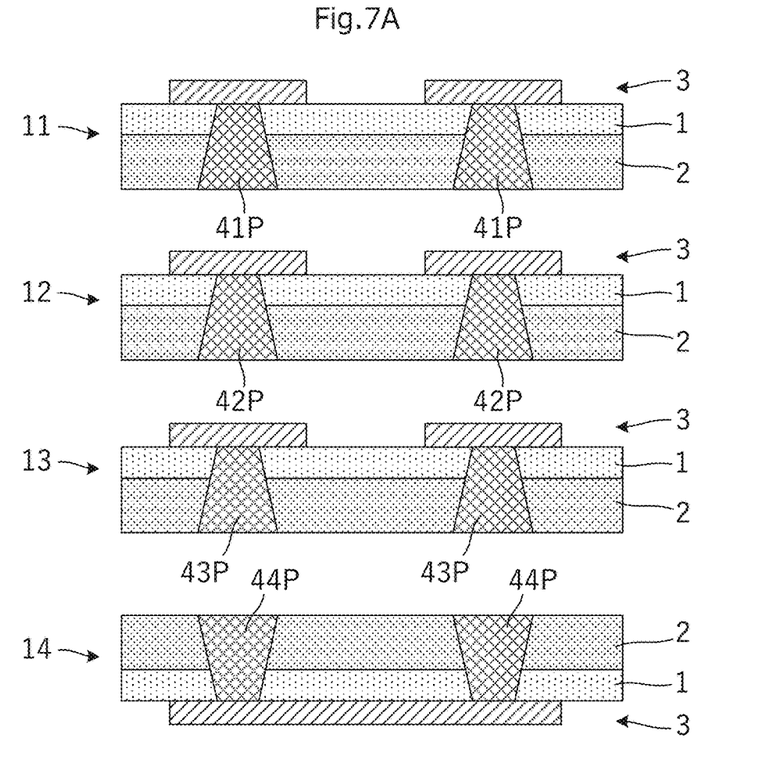
FIG. 7A is a longitudinal sectional view during manufacturing of a stacked body according to a third preferred embodiment.
Figure 7B:
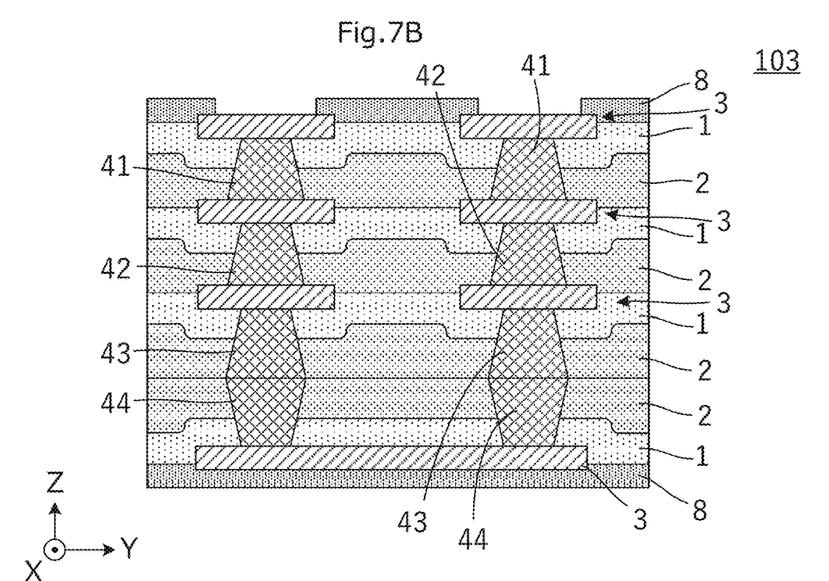
FIG. 7B is a longitudinal sectional view of a stacked body 103 according to the third preferred embodiment of the present invention.

FIG. 7A is a longitudinal sectional view during manufacturing of a stacked body according to a third preferred embodiment of the present invention. FIG. 7B is a longitudinal sectional view of a stacked body 103 according to the third preferred embodiment.

The stacked body 103 is formed by stacking the stacked sheets 11 to 14, and heating and pressing them. The stacked body 103 includes a first resin layer 1, a conductor layer 3 provided on one principal surface of the first resin layer 1, a second resin layer 2, and a protective layer 8. In addition, the stacked body 103 includes interlayer connecting conductors 41, 42, 43, and 44 that penetrate each of the first resin layer 1 and the second resin layer 2. It should be noted that the stacked body 103 includes protective layers 8 on both sides in the stacking direction. The protective layers 8 are formed, for example, by applying an epoxy resin or attaching a polyimide film.

As shown in FIG. 7A, at a stage before stacking the stacked sheets 11 to 14, the stacked sheets 11 to 14 include the interlayer connecting conductors 41P, 42P, 43P, and 44P in a state before heating, respectively. The interlayer connecting conductors 41P, 42P, 43P, and 44P in the state before heating penetrate the first resin layer 1 and the second resin layer 2, and each of them has a wider opposite surface as compared with a surface in contact with the conductor layer 3.

The interlayer connecting conductor 43P in a state before heating provided on the third stacked sheet 13 and the interlayer connecting conductor 44P in a state before heating provided on the fourth stacked sheet 14 have their opposite surfaces facing each other and have the interlayer connecting conductors being directly joined.

According to the present preferred embodiment, since the interlayer connecting conductors 43 and 44 are joined to each other on wider surfaces, even if the first resin layer 1 and the second resin layer 2 flow during heating and pressurization, such as a stacked press, it is possible to reduce the joining failure between the interlayer connecting conductors due to the displacement of the interlayer connecting conductors 43 and 44.

Fourth Preferred Embodiment

In a fourth preferred embodiment of the present invention, an example of a manufacturing method different from the manufacturing method of the stacked body shown in the first preferred embodiment is shown.

Figure 8:
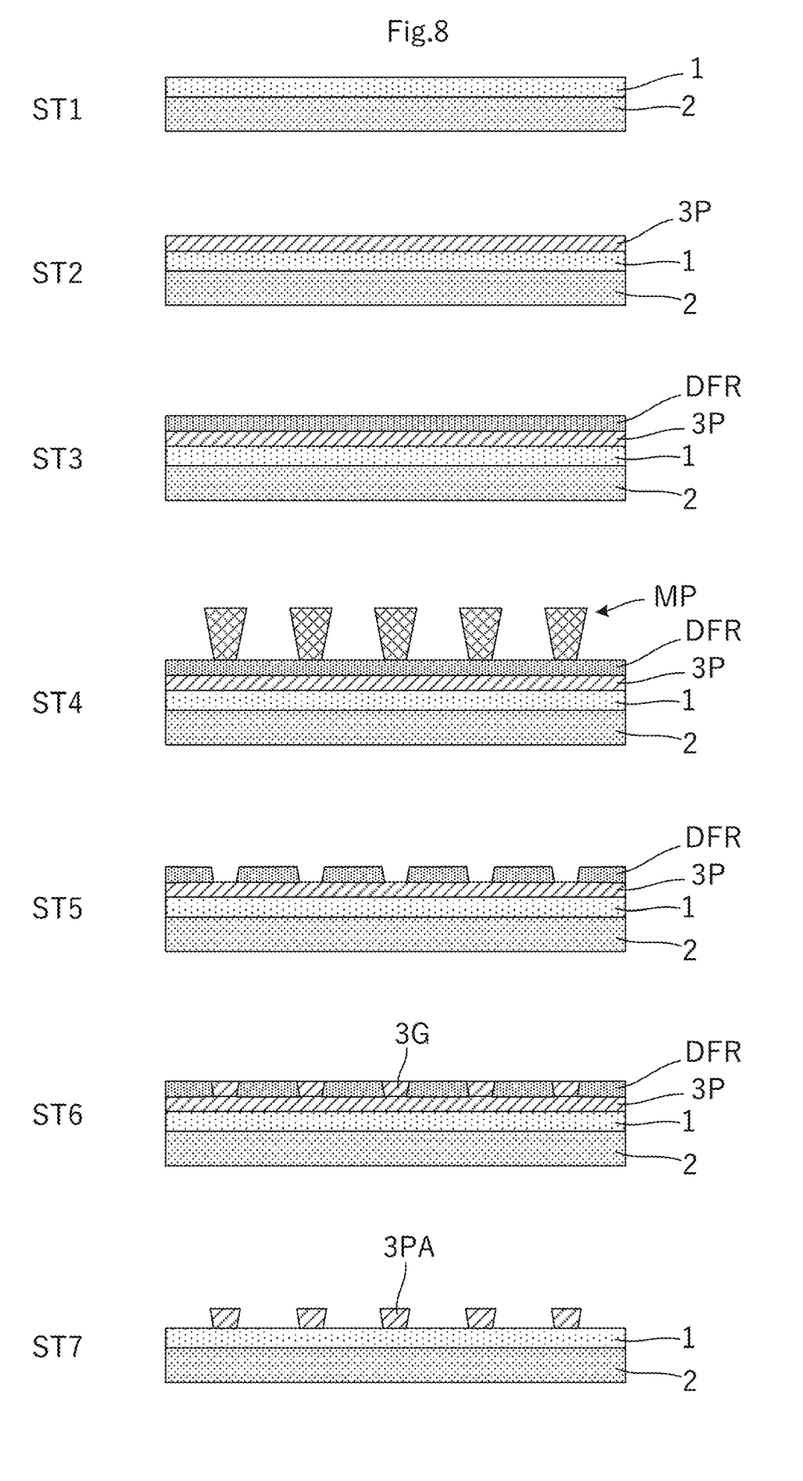
FIG. 8 is a diagram showing a method for manufacturing a stacked body according to a fourth preferred embodiment of the present invention.

FIG. 8 is a diagram showing a method for manufacturing a stacked body according to a fourth preferred embodiment of the present invention. In FIG. 8, ST1 to ST7 represent the numbers of each step. In step ST1, the first resin layer is stacked on the second resin layer 2. In step ST2, a first conductor layer 3P as a seed layer is formed on the surface of the first resin layer 1 by electroless Cu plating or the like, for example.

In step ST3, the dry film resist DFR is attached. In step ST4, the mask pattern MP is superimposed and exposed.

In step ST5, the dry film resist DFR is developed. In step ST6, the opening of the dry film resist DFR is filled with the second conductor layer 3G being a Cu film by being plated with a Cu film, for example. Thereafter, in step ST7, peeling off the dry film resist DFR and etching the first conductor layer 3P and the second conductor layer 3G forms the conductor pattern 3PA.

According to the present preferred embodiment, the cross-sectional shape of the conductor pattern 3PA is a reverse taper shape, as is clear when compared with the structure in step ST4 in FIG. 5. Even if the conductor pattern 3PA having such a cross-sectional shape is formed, stacking the stacked sheets and then heating and pressing them enables a structure in which the conductor pattern 3PA is partially embedded into the first resin layer 1 to be obtained.

Fifth Preferred Embodiment

In a fifth preferred embodiment of the present invention, a stacked body different from the stacked body shown in the first preferred embodiment in the relationship between the pattern formed by the conductor layer and the resin layer adjacent thereto is shown.

Figure 9A:
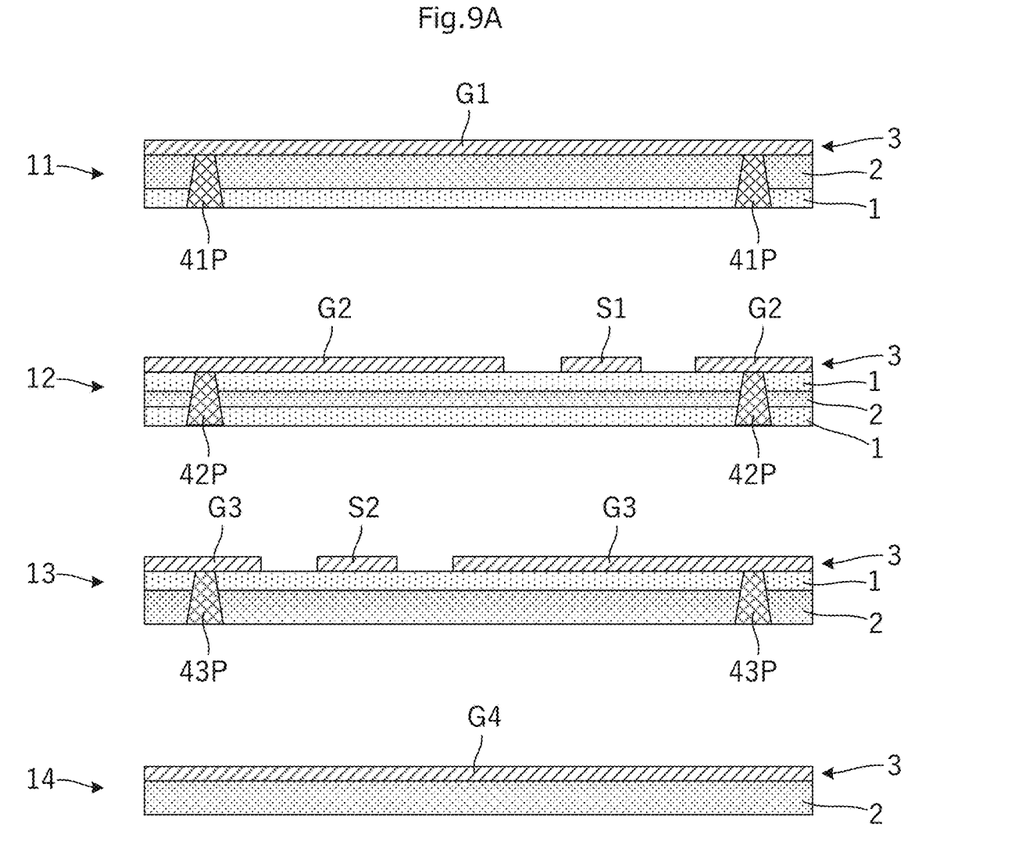
FIG. 9A is a longitudinal sectional view during manufacturing of a stacked body according to a fifth preferred embodiment.
Figure 9B:
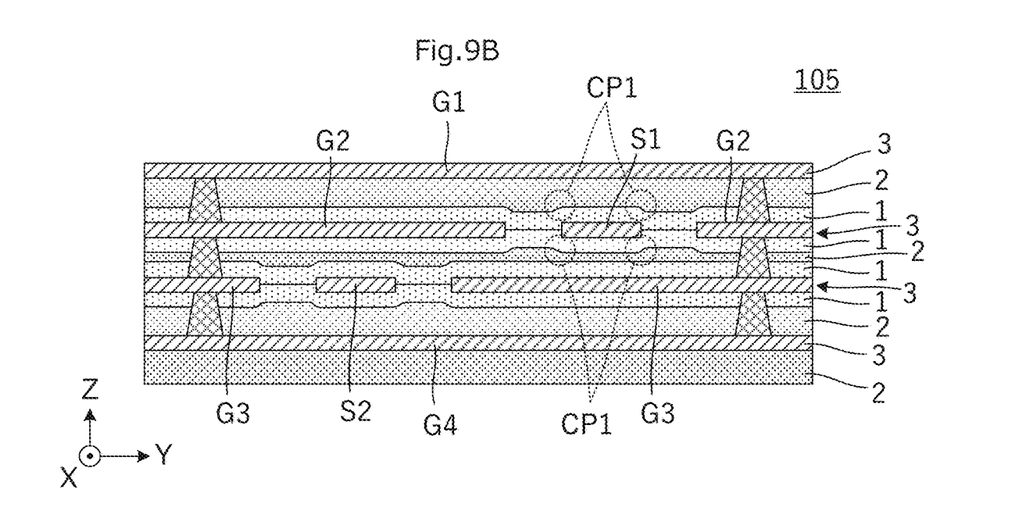
FIG. 9B is a longitudinal sectional view of a stacked body 105 according to the fifth preferred embodiment of the present invention.

FIG. 9A is a longitudinal sectional view during manufacturing of a stacked body according to a fifth preferred embodiment of the present invention. FIG. 9B is a longitudinal sectional view of a stacked body 105 according to the fifth preferred embodiment.

The stacked body 105 includes a first stacked sheet 11, a second stacked sheet 12, a third stacked sheet 13, and a fourth stacked sheet 14 at a stage before the lamination.

The stacked sheet 11 includes a first resin layer 1, a second resin layer 2 joined to one surface of the first resin layer 1, and a conductor layer 3 provided on the second resin layer 2.

The stacked sheet 12 includes a second resin layer 2, first resin layers 1 stacked on both surfaces of the second resin layer, and a conductor layer 3 provided on one surface of the first resin layer 1.

The stacked sheet 13 includes a first resin layer 1, a conductor layer 3 provided on one surface of the first resin layer 1, and a second resin layer 2 joined to the other surface of the first resin layer 1.

The stacked sheet 14 includes a second resin layer 2 and a conductor layer 3 provided on one surface of the second resin layer 2.

In the example shown in FIG. 9A, in the first stacked sheet 11, an interlayer connecting conductor 41P in a state before heating which conducts with the conductor layer 3 is formed in the first resin layer 1 and the second resin layer 2. The conductor layer 3 of the first stacked sheet 11 is formed as a ground conductor pattern G1. In the second stacked sheet 12, an interlayer connecting conductor 42P in a state before heating which conducts with the conductor layer 3 is formed in the two first resin layers 1 and the second resin layer 2. The conductor layer 3 of the second stacked sheet 12 is formed as a ground conductor pattern G2 and a signal conductor pattern S1. In the third stacked sheet 13, an interlayer connecting conductor 43P in a state before heating which conducts with the conductor layer 3 is formed in the first resin layer 1 and the second resin layer 2. The conductor layer 3 of the third stacked sheet 13 is formed as a ground conductor pattern G3 and a signal conductor pattern S2. The conductor layer 3 of the fourth stacked sheet 14 is formed as a ground conductor pattern G4.

The stacked body 105 shown in FIG. 9B is formed by stacking the stacked sheets 11 to 14, and heating and pressing them. As shown in FIG. 9B, the signal conductor patterns S1 and S2 are embedded in the first resin layer 1, and in the first resin layer 1, protruding portions CP along the corner portions of the signal conductor patterns S1 and S2 are formed. With this structure, the periphery of the corner portion of the signal conductor pattern having high electric field intensity is more thickly covered with the first resin layer having a low dielectric constant, so that the effect of improving the high frequency characteristics is great.

According to the present preferred embodiment, since both layers sandwiching the signal conductor patterns S1 and S2 are the first resin layer 1, higher high frequency characteristics can be obtained. It should be noted in the present preferred embodiment, the second resin layer 2 is in contact with the ground conductor patterns G1 and G4, but since the electric field intensity on the surface of the ground conductor patterns G1 and G4 and the current density of the ground conductor patterns G1 and G4 are smaller than those of the signal conductor patterns S1 and S2, high frequency characteristics are less likely to deteriorate.

Sixth Preferred Embodiment

In a sixth preferred embodiment of the present invention, an example of an electronic apparatus including a stacked body according to a preferred embodiment of the present invention is illustrated.

Figure 10:
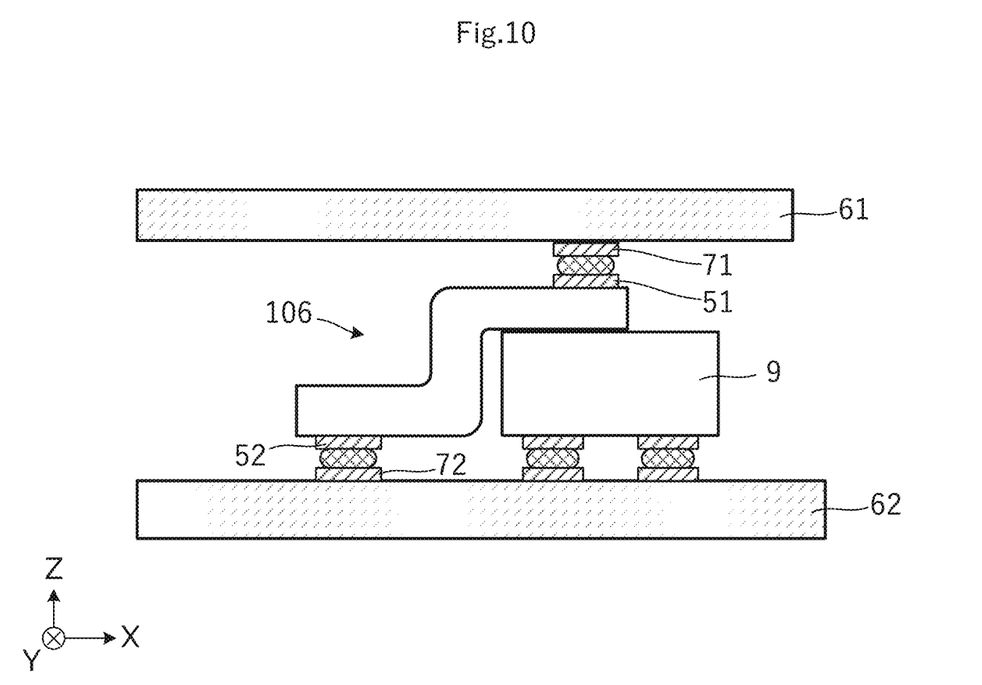
FIG. 10 is a cross-sectional view of an electronic apparatus according to the fifth preferred embodiment of the present invention.

FIG. 10 is a cross-sectional view of the electronic apparatus of the present preferred embodiment. The electronic apparatus includes substrates 61 and 62, a stacked body 106, and a component 9, such as a battery, for example. The component 9 is mounted on the upper surface of the substrate 62. An electrode 51 is provided on the upper surface of the stacked body 106, and an electrode 52 is provided on the lower surface of the stacked body 106. The stacked body 106 includes electrodes 51 and 52 provided on the stacked body 101 shown in the first preferred embodiment.

The stacked body 106 connects the electrode 72 on the upper surface of the substrate 62 and the electrode 71 on the lower surface of the substrate 61. That is, the electrodes 51 and 52 of the stacked body 106 are soldered to the electrodes 71 and 72 of the substrates 61 and 62.

Thus, the stacked body 106 can be used as a flexible multicore high-frequency signal cable. However, since the stacked body 106 has shape retention, the stacked body 106 can be preformed as shown in FIG. 10 before being mounted on the substrate 62, the stacked body 106 can be mounted on the substrate 62 with this shape retained. In addition, after that, the electrode 71 of the substrate 61 can be easily connected to the electrode 51 of the stacked body 106. According to the present preferred embodiment, since the stacked body 106 is a multilayer substrate that is relatively soft and includes the first resin layer 1, the stacked body 106 is easily bent as a whole and can be easily arranged in a limited space.

Lastly, the description of the preferred embodiments described above is exemplary in all respects and not limiting. Modifications and changes can be made as appropriate for those skilled in the art. The scope of the present invention is indicated by the scope of the claims, not by the above-described preferred embodiments. Furthermore, the scope of the present invention includes changes from the preferred embodiments within the scope of the claims and within the scope of equivalents.

For example, the first resin layer 1 may be a resin layer including LCP as a main material, and the second resin layer 2 may be a glass and epoxy substrate (FR4 substrate). Also in this case, the first resin layer 1 is softer than the second resin layer 2, and the first resin layer 1 has a lower dielectric constant than the second resin layer 2. In addition, the first resin layer 1 has a smaller dielectric loss tangent than the second resin layer 2. In addition, for example, a polyimide sheet may be used as the second resin layer 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A stacked body comprising:
   first resin layers including thermoplastic;
   a conductor pattern provided on one principal surface of the first resin layers; and
   second resin layers including thermoplastic; wherein
   the first resin layers are softer than the second resin layers;
   the first resin layers have a lower dielectric constant than the second resin layers;
   the first resin layers sandwich the conductor pattern from both sides in a stacking direction of the stacked body;
   the first resin layers and the conductor pattern are located between the second resin layers in the stacking direction; and
   at least one of the first resin layers includes a first protruding portion along a corner portion of the conductor pattern embedded in the first resin layers on a surface opposite to the one principal surface.

2. The stacked body according to claim 1, wherein a thickness of the second resin layers is larger than a thickness of the first resin layers.

3. The stacked body according to claim 1, wherein
   a main material of the first resin layers is fluororesin; and
   a main material of the second resin layers is a liquid crystal polymer.

4. The stacked body according to claim 1, wherein a cross-sectional shape of the conductor pattern in the stacking direction includes the corner portion embedded in the first resin layers.

5. The stacked body according to claim 1, further comprising:
   an inclined portion at an edge of the conductor pattern in a cross-sectional shape; wherein
   the corner portion embedded in the first resin layers has an acute angle.

6. The stacked body according to claim 1, wherein the second resin layers sandwich the first resin layers from both sides in the stacking direction.

7. The stacked body according to claim 1, further comprising:
- a signal conductor pattern; wherein
- a thickness in the stacking direction of the first resin layers overlapping with the signal conductor pattern when viewed in the stacking direction is equal or approximately equal to a thickness in the stacking direction of the first resin layers not overlapping with the signal conductor pattern when viewed in the stacking direction.

8. The stacked body according to claim 1, further comprising:
- a signal conductor pattern; wherein
- a thickness in the stacking direction of the second resin layers overlapping with the signal conductor pattern when viewed in the stacking direction is smaller than a thickness in the stacking direction of the second resin layers not overlapping with the signal conductor pattern when viewed in the stacking direction.

* * * * *